United States Patent
Hironaka et al.

(10) Patent No.: US 11,293,946 B2
(45) Date of Patent: Apr. 5, 2022

(54) CONDUCTIVE CONTACTOR UNIT

(71) Applicant: NHK Spring Co., Ltd., Yokohama (JP)

(72) Inventors: Kohei Hironaka, Kanagawa (JP); Tsuyoshi Inuma, Kanagawa (JP)

(73) Assignee: NHK Spring Co., Ltd., Yokohama (JP)

( * ) Notice: Subject to any disclaimer, the term of this patent is extended or adjusted under 35 U.S.C. 154(b) by 208 days.

(21) Appl. No.: 16/618,930

(22) PCT Filed: Jun. 14, 2018

(86) PCT No.: PCT/JP2018/022678
§ 371 (c)(1),
(2) Date: Dec. 3, 2019

(87) PCT Pub. No.: WO2018/230627
PCT Pub. Date: Dec. 20, 2018

(65) Prior Publication Data
US 2020/0141975 A1  May 7, 2020

(30) Foreign Application Priority Data
Jun. 14, 2017 (JP) .............................. JP2017-117218

(51) Int. Cl.
*G01R 31/26* (2020.01)
*G01R 1/067* (2006.01)
(Continued)

(52) U.S. Cl.
CPC ......... *G01R 1/06722* (2013.01); *G01R 1/045* (2013.01); *G01R 1/0483* (2013.01);
(Continued)

(58) Field of Classification Search
CPC . G01R 1/067; G01R 1/06716; G01R 1/06722
See application file for complete search history.

(56) References Cited

U.S. PATENT DOCUMENTS

| 5,414,369 A | 5/1995 | Kazama |
| 7,190,179 B2 | 3/2007 | Haga et al. |

(Continued)

FOREIGN PATENT DOCUMENTS

| JP | H06-201725 A | 7/1994 |
| JP | 2002-124552 A | 4/2002 |

(Continued)

OTHER PUBLICATIONS

Notification of Reasons for Refusal dated Dec. 6, 2018, issued for the corresponding Taiwan Application No. 107120526 and English translation thereof.

(Continued)

*Primary Examiner* — Tung X Nguyen
(74) *Attorney, Agent, or Firm* — Locke Lord LLP

(57) ABSTRACT

A conductive contactor unit includes: a signal conductive contactor configured to input or output a signal to or from a predetermined circuit structure, the signal conductive contactor including a first plunger, a second plunger, and a spring member; and a conductive contactor holder configured to house the signal conductive contactor used for inputting and outputting the signal to and from the predetermined circuit structure, the conductive contactor holder having a coaxial structure with the signal conductive contactor, and including a holder substrate including an opening configured to allow the signal conductive contactor to be inserted therethrough, a holding member housed in the opening, and including a holding hole configured to hold one or more of the signal conductive contactors, and a stab configured to form a hollow space extending from the holding hole in a direction perpendicular to a central axis of the holding hole.

8 Claims, 15 Drawing Sheets

(51) Int. Cl.
*G01R 1/04* (2006.01)
*G01R 1/073* (2006.01)
*G01R 31/28* (2006.01)
*H01R 13/24* (2006.01)
*H01R 13/6596* (2011.01)

(52) U.S. Cl.
CPC ......... *G01R 1/07314* (2013.01); *G01R 31/26* (2013.01); *G01R 31/2886* (2013.01); *H01R 13/2421* (2013.01); *H01R 13/6596* (2013.01)

(56) References Cited

U.S. PATENT DOCUMENTS

| | | |
|---|---|---|
| 8,344,747 B2 | 1/2013 | Kazama et al. |
| 8,911,266 B2 | 12/2014 | Kawate et al. |
| 9,291,645 B2 | 3/2016 | Matsui et al. |
| 2009/0221186 A1* | 9/2009 | Nakayama ......... G01R 1/07314 439/660 |
| 2010/0087075 A1* | 4/2010 | Kazama ............... G01R 1/0466 439/85 |
| 2012/0019277 A1 | 1/2012 | Kazama et al. |
| 2013/0065455 A1* | 3/2013 | Kawata .................. H01L 23/32 439/700 |

FOREIGN PATENT DOCUMENTS

| | | |
|---|---|---|
| JP | 2016-070863 A | 5/2016 |
| TW | 1276804 B | 3/2007 |
| TW | 201208213 A | 2/2012 |
| TW | 201331587 A | 8/2013 |
| TW | 201702392 A | 1/2017 |
| WO | 2010/114164 A1 | 10/2010 |

OTHER PUBLICATIONS

International Search Report dated Aug. 28, 2018, issued for PCT/JP2018/022678.

* cited by examiner

CONDUCTIVE CONTACTOR UNIT

FIELD

The present invention relates to a conductive contactor unit for housing a signal conductive contactor configured to input or output electric signals from or to a predetermined circuit structure.

BACKGROUND

Conventionally, in the technical field related to electric characteristic testing of a semiconductor integrated circuit, a technology related to a conductive contactor unit having a plurality of conductive contactors that are arranged correspondingly to external contact electrodes of a semiconductor integrated circuit has been known. Such a conductive contactor unit includes a plurality of conductive contactors, a conductive contactor holder having an opening for housing the conductive contactors, and a tester circuit that is electrically connected to the conductive contactors (see Patent Literature 1, for example).

CITATION LIST

Patent Literature

Patent Literature 1: Japanese Laid-open Patent Publication No. 2002-124552

SUMMARY

Technical Problem

As semiconductor integrated circuits have recently come to have a smaller size and to operate at a higher speed, it also has come to be necessary to use a smaller-sized structure capable of operating at a higher speed as the conductive contactor unit. Generally, when inputting and outputting high-frequency electric signals, the signals go through a signal loss referred to as an insertion loss. To allow a conductive contactor unit to operate highly accurately at a high speed, it is important to reduce the insertion loss in a particular frequency range, e.g., a frequency range where the resonance occurs, within the frequency range that is used in causing a device under test to operate.

The present invention is made in consideration of the above, and an object of the present invention is to provide a conductive contactor unit capable of reducing an insertion loss at a particular frequency.

Solution to Problem

To solve the above-described problem and achieve the object, a conductive contactor unit according to the present invention includes: a signal conductive contactor configured to input or output a signal to or from a predetermined circuit structure, the signal conductive contactor including a first plunger configured to contact the predetermined circuit structure, a second plunger connected to a circuit board configured to input or output the signal to or from the predetermined circuit structure, and a spring member configured to connect the first plunger and the second plunger in an extendable and contractible manner; and a conductive contactor holder configured to house the signal conductive contactor used for inputting and outputting the signal to and from the predetermined circuit structure, the conductive contactor holder having a coaxial structure with the signal conductive contactor, and including a holder substrate including an opening configured to allow the signal conductive contactor to be inserted therethrough, a holding member housed in the opening, and including a holding hole configured to hold one or more of the signal conductive contactors, and a stab configured to form a hollow space extending from the holding hole in a direction perpendicular to a central axis of the holding hole.

Moreover, in the above-described conductive contactor unit according to the present invention, denoting a length between a tip of the first plunger and the stab at a position in a direction of a central axis of the holding hole at time of inputting or outputting the signal as $D_1$, and denoting a length of the stab in a direction in which the stab extends from the central axis of the holding hole as $L_1$, the stab satisfies:

$$D_1 = \tan^{-1} \frac{1}{A_{SRW}} \times \frac{\lambda}{2\pi} \quad (1)$$

$$L_1 = \tan^{-1} \frac{A_{SRW} - 1}{A_{SRW}} \times \frac{\lambda}{2\pi} \quad (2)$$

(where $A_{SRW}$ is a standing wave ratio ($A_{SRW} = Z_0/Z_a$, where $Z_0$ is a characteristic impedance, $Z_a$ is a pure resistance ($<Z_0$), $\overline{A_{SRW}}$ (with a line on top thereof) is a conjugate complex number of $A_{SRW}$, and $\lambda$ is a wavelength at a particular frequency).

Moreover, in the above-described conductive contactor unit according to the present invention, each of the holder substrate and the holding member includes two element members configured to form a boundary in a direction intersecting with an axial line direction of the opening, and divide the conductive contactor holder, and the stab is formed between the two element members.

Moreover, in the above-described conductive contactor unit according to the present invention, a tip of the stab in an extending direction is brought into contact with an outer circumferential surface of the holder substrate.

Moreover, the above-described conductive contactor unit according to the present invention further includes an adjustment member inserted into a tip side of the stab in the extending direction, and configured to be capable of adjusting a length of the stab in the extending direction.

Moreover, in the above-described conductive contactor unit according to the present invention, each of the holder substrate and the holding member includes two element members configured to divide the conductive contactor holder in a direction intersecting with an axial line direction of the opening, and the stab is provided to one of the two element members.

Moreover, in the above-described conductive contactor unit according to the present invention, the stab forms a disk-like hollow space that is rotationally symmetric with respect to a central axis of the holding hole.

Moreover, a conductive contactor unit according to the present invention includes: a signal conductive contactor configured to input or output a signal to or from a predetermined circuit structure, the signal conductive contactor including a first plunger configured to contact the predetermined circuit structure, a second plunger connected to a circuit board configured to input or output the signal to or from the predetermined circuit structure, and a spring member configured to connect the first plunger and the second plunger in an extendable and contractible manner; and a holder substrate including a plurality of housing units configured to house a plurality of the signal conductive contactors, respectively, wherein at least one of the first plunger and the second plunger includes a stab protruding from an outer surface in a direction perpendicular to an axial line direction of the plunger.

Moreover, in the above-described conductive contactor unit according to the present invention, denoting a length between a tip of the first plunger and the stab at a position in the axial line direction of the first plunger as $D_2$, and denoting a length of the stab from a central axis of the first plunger in a direction perpendicular to the axial line direction as $L_2$, the stab satisfies:

$$D_2 = \tan^{-1} \overline{B_{SRW}} \times \frac{\lambda}{2\pi} \quad (3)$$

$$L_2 = \tan^{-1} \frac{\overline{B_{SRW}}}{B_{SRW} - 1} \times \frac{\lambda}{2\pi} \quad (4)$$

(where $B_{SRW}$ is a standing wave ratio ($B_{SRW}=Z_a/Z_0$, $Z_0$ is a characteristic impedance, $Z_a$ is a pure resistance (>$Z_0$), $\overline{B_{SRW}}$ (with a line on top thereof) is a conjugate complex number of $B_{SRW}$, and $\lambda$ is a wavelength at a particular frequency).

Moreover, in the above-described conductive contactor unit according to the present invention, the stab has a disk-like shape that is rotationally symmetric with respect an axial line of the plunger having the stab.

Advantageous Effects of Invention

According to the present invention, it is possible to reduce the insertion loss in a particular frequency range.

DESCRIPTION OF EMBODIMENTS

Figure 1:
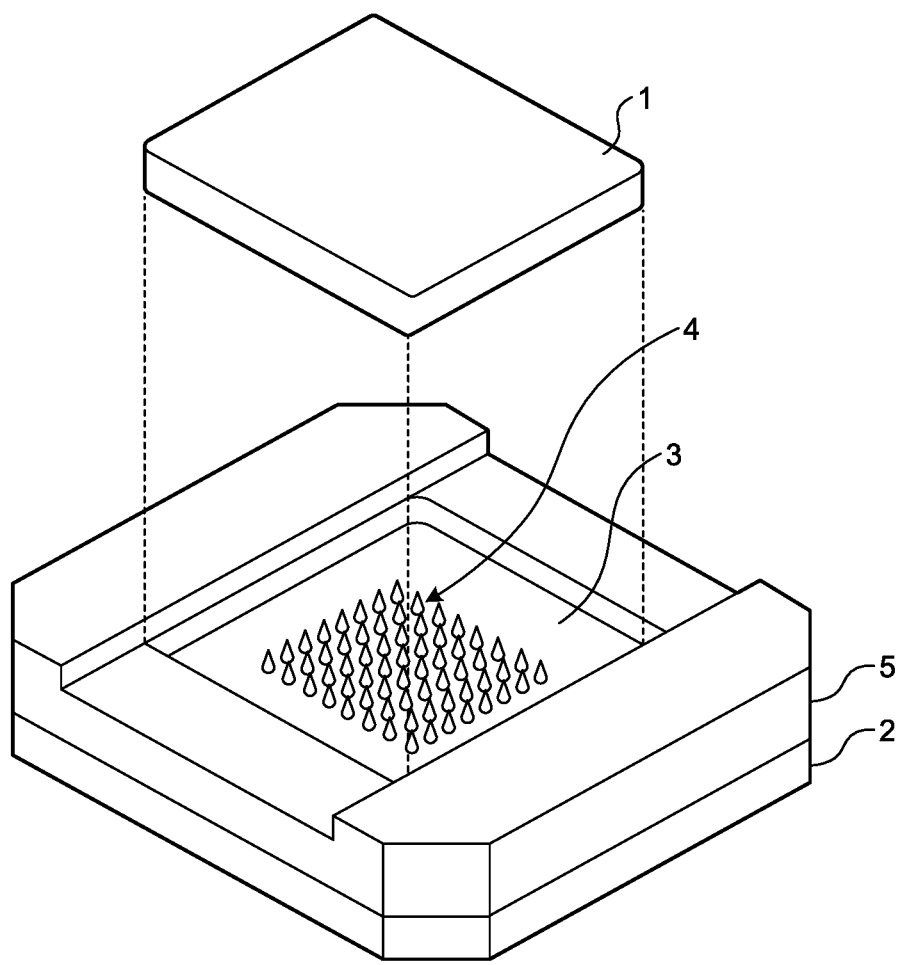
FIG. 1 is a schematic illustrating the entire configuration of a conductive contactor unit according to a first embodiment of the present invention.

Some embodiments of the present invention will now be explained in detail with some drawings. The embodiments described below are, however, not intended to limit the scope of the present invention in any way. The drawings to which references are made in the following explanation are merely schematic representations illustrating shapes, sizes, and positional relations to a degree enabling understanding of the present invention, and therefore, the present invention is not limited to the shapes, the sizes, and the positional relations that are illustrated in the drawings.

First Embodiment

To begin with, a conductive contactor unit according to a first embodiment will be explained. The conductive contactor unit according to the first embodiment is for inputting and outputting electric signals to and from a predetermined circuit structure, such as a semiconductor integrated circuit, and supplying power and a ground potential to the predetermined circuit structure. In particular, the conductive contactor unit has a structure in which a ground conductive contactor via which the ground potential is supplied is electrically connected to a conductive contactor holder made of a conductive material in order to ensure that the ground potential is supplied stably. A coaxial structure as mentioned herein will mean a coaxial structure in which the central axis of a signal conductive contactor is matched with the central axis of the tubular inner surface of a ground.

FIG. 1 is a schematic illustrating a structure of the conductive contactor unit according to the first embodiment. As illustrated in FIG. 1, the conductive contactor unit according to the first embodiment includes a circuit board 2 that has a circuit for performing processes such as generation of signals to be supplied to a semiconductor integrated circuit 1, a conductive contactor holder 3 that is placed on the circuit board 2, and that has predetermined openings (not illustrated in FIG. 1), and conductive contactors 4 that are housed in the respective openings of the conductive contactor holder 3. A holder member 5 for suppressing displacement of the semiconductor integrated circuit 1 during the use is placed on the circuit board 2, and around the outer circumference of the conductive contactor holder 3.

The circuit board 2 includes a tester circuit for testing the electrical characteristics of the semiconductor integrated circuit 1 that is a device under test. The circuit board 2 has a structure that is provided with electrodes (not illustrated in FIG. 1) for electrically connecting a circuit provided internal of the circuit board 2 to the conductive contactors 4, and the electrodes are disposed on a surface where the circuit board 2 is brought into contact with the conductive contactor holder 3.

The conductive contactor holder 3 is for housing the conductive contactors 4. Specifically, the conductive contactor holder 3 includes a holder substrate made of a conductive material such as a metal, and an insulating member covering a necessary area of the holder substrate. The holder substrate has a structure having openings at areas corresponding to the positions where the conductive contactors 4 are arranged, and the conductive contactors 4 are housed in the respective openings.

The conductive contactors 4 electrically connect the circuit provided internal of the circuit board 2 to the semiconductor integrated circuit 1. The conductive contactors 4 are generally classified into three patterns depending on the type of signals to be supplied to the semiconductor integrated circuit, for example. Specifically, the conductive contactors 4 include a signal conductive contactor for inputting and outputting electric signals to and from the semiconductor integrated circuit 1, a ground conductive contactor for supplying a ground potential to the semiconductor integrated circuit 1, and a power-supplying conductive contactor for supplying power to the semiconductor integrated circuit 1. In the explanation below, the signal conductive contactor, the ground conductive contactor, and the power-supplying conductive contactor will be collectively referred to as conductive contactors, and the names of the respective contactors will be used when references are made to the individual conductive contactors.

Figure 2:
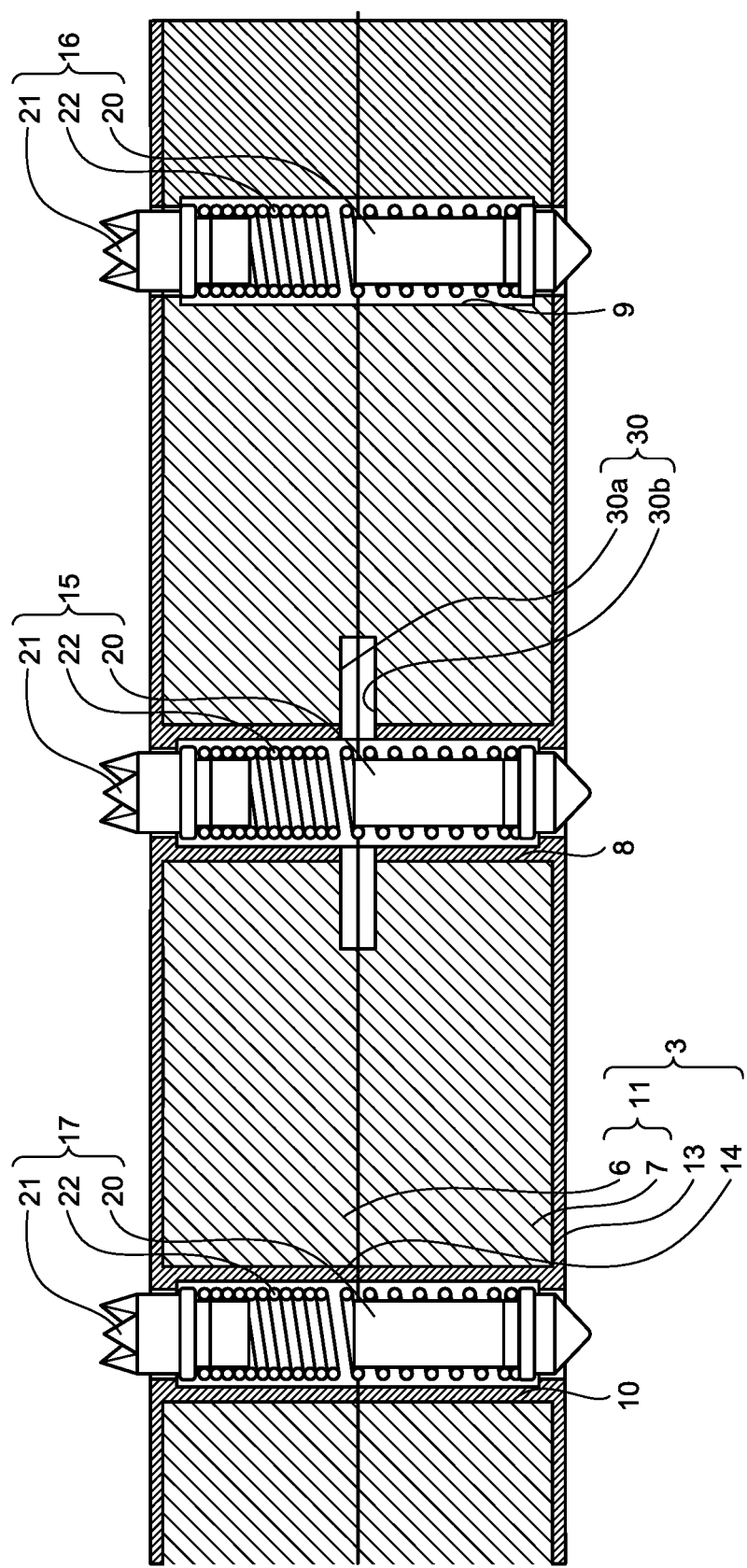
FIG. 2 is a partial sectional view illustrating a detailed structure of a conductive contactor holder and conductive contactors included in the conductive contactor unit according to the first embodiment of the present invention.

FIG. 2 is a partial sectional view illustrating a detailed structure of the conductive contactor holder 3 and the conductive contactors 4. As illustrated in FIG. 2, the conductive contactor holder 3 has a structure in which a first substrate 6 and a second substrate 7 made of a conductive material are coupled to each other with some screw members. The conductive contactor holder 3 includes a holder substrate 11 that has a first opening 8, a second opening 9, and a third opening 10 penetrating the first substrate 6 and the second substrate 7, an insulating member 13 and an insulating member 14 covering the inner surface of the first opening 8 and the third opening 10, and also covering surface of the holder substrate 11. Hereinafter, a coaxial structure in which the central axis of the signal conductive contactor is matched with the central axis of the inner surface of the holder substrate 11 will be referred to as a coaxial structure.

A structure of the conductive contactor will now be explained. Although a signal conductive contactor 15, a ground conductive contactor 16, and a power-supplying conductive contactor 17 have different functions, because it is possible to consider all of these conductive contactors to have the same specific structure, a structure of the signal conductive contactor 15 will be explained below as a representative example.

The signal conductive contactor 15 includes a needle-like member 20 that is to be electrically connected to an electrode provided to the circuit board 2, a needle-like member 21 that is to be electrically connected to a connecting electrode provided to the semiconductor integrated circuit 1 during the use, and a spring member 22 that is provided between the needle-like member 20 and the needle-like member 21, that electrically connects the needle-like members 20, 21, and that allows the signal conductive contactor 15 to extend and to contract along the long-axis direction. The needle-like member 20, the needle-like member 21, and the spring member 22 have such structures that, when these member are housed in the first opening 8, the axial lines thereof are matched with the axial line of the first opening 8, and these members are allowed to move in the axial direction. In the description herein, the needle-like member that is to be electrically connected to the connecting electrode provided to the semiconductor integrated circuit 1 during the use (the needle-like member 21 in the first embodiment) corresponds to a first plunger, and the needle-like member that is to be electrically connected to an electrode provided to the circuit board 2 (the needle-like member 20 in the first embodiment) corresponds to a second plunger.

The needle-like member 20 is intended to be electrically connected to an electrode disposed on the surface of the circuit board 2. Specifically, the needle-like member 20 has a pointed end on the side facing the circuit board 2, and is configured in such a manner that the pointed end is brought into contact with the electrode provided to the circuit board 2. Because the needle-like member 20 is movable in the axial line direction by the extension and the contraction of the spring member 22, the needle-like member 20 is suitably brought into contact in a manner corresponding to the recessed and protruding shape of the electrode provided to the circuit board 2, and can be brought into contact with the electrode while a contact resistance is reduced by the pressing force of the spring member 22 in the extending direction.

The needle-like member 20 also has a flange portion protruding in a direction perpendicular to the axial line, as illustrated in FIG. 2. As mentioned earlier, because the inner diameter of the first opening 8 is smaller near the bottom surface of the holder substrate 11, the flange portion is brought into abutment against the insulating member 13 provided on the inner surface of the first opening 8, as the needle-like member 20 is moved downwards, so that the needle-like member 20 is prevented from coming out from the first opening 8.

The needle-like member 21 is intended to be electrically connected to a connecting electrode provided to the semiconductor integrated circuit 1 during the use of the conductive contactor unit according to the first embodiment. Specifically, the needle-like member 21 has a structure in which an end facing the side of the semiconductor integrated circuit 1 is brought into contact with the connecting electrode. The needle-like member 21 also has a structure that is movable in the axial line direction, by the extension and the contraction of the spring member 22, in the same manner as the needle-like member 20, and is prevented from coming out by being provided with a flange portion protruding in a direction perpendicular to the axial line. With such a structure, the conductive contactor electrically connects the electrode provided to the circuit board 2 to the connecting electrode provided to the semiconductor integrated circuit 1.

The holder substrate 11 (the first substrate 6, the second substrate 7) is made of a material having conductivity, and serves as a base material of the conductive contactor holder 3. Specifically, the holder substrate 11 is made of a conductive material.

The first opening 8, the second opening 9, and the third opening 10 house the signal conductive contactor 15 that inputs or outputs signals to or from the semiconductor integrated circuit 1, the ground conductive contactor 16 that supplies the ground potential, and the power-supplying conductive contactor 17 that supplies power, respectively. These openings have a columnar shape, and penetrate the holder substrate 11. By providing such a shape to the openings, these openings serve a function as an aligning unit and a guiding unit for the conductive contactors. These openings such as the first opening 8 is formed by etching or punching the first substrate 6 and the second substrate 7, or machining these substrates using a laser, an electron beam, an ion beam, or wire-electrical discharge.

The first opening 8 and the third opening 10 have a larger inner diameter than that of the second opening 9, by a size corresponding to the size of the insulating member 13, 14 provided on the inner surface thereof. The second opening 9 is provided with an inner diameter that is approximately the same as the outer diameter of the ground conductive contactor 16 so that the guiding function and the grounding function are achieved. By contrast, the first opening 8 and the third opening 10 have functions for housing the signal conductive contactor 15 and the power-supplying conductive contactor 17, respectively, via the insulating members 13, 14. The diameter of the second opening 9 may be different from that of the ground conductive contactor 16, as long as the second opening 9 can hold the ground conductive contactor 16.

The inner diameters of the first opening 8, the second opening 9, and the third opening 10 are all set smaller near the top surface and the bottom surface of the holder substrate 11 so that the conductive contactors are prevented from coming out from the respective openings. Because the conductive contactors have protrusions for preventing the conductive contactors from coming out from the respective openings, as will be described later, these inner diameters are set smaller near the top surface and the bottom surface, so that the protrusions of the conductive contactors are brought into abutment against the openings. Furthermore, to achieve openings having smaller inner diameters near the top surface as well as the bottom surface, the holder substrate 11 is provided with a structure that is divided into the first substrate 6 and the second substrate 7, so that the conductive contactors can be housed in the respective openings including the first opening 8, in the process of fabrication.

The insulating members 13, 14 are formed on the inner surface of the first opening 8 and the third opening 10, respectively, to serve a function for electrically insulating the signal conductive contactor 15 and the power-supplying conductive contactor 17 from the holder substrate 11. The insulating members 13, 14 are also provided on the outer surfaces of the holder substrate 11, to serve a function for electrically insulating the semiconductor integrated circuit 1 and the circuit board 2 from the holder substrate 11. In the first embodiment, the materials of which the insulating members 13, 14 are made, and the thicknesses and the like of the insulating members 13, 14 are not limited to particular specifications, and insulating members 13, 14 having any thicknesses may be fabricated using any materials, as long as the specifications can ensure that sufficient insulation functions are achieved. The insulating members 13, 14 correspond to a holding member according to the present invention, and may also be formed as a film by applying coating, for example. It is also possible to place a cylindrical insulating member on the inner surface of the first opening 8 and the third opening 10, and then to place a plate-like insulating member on the outer surface of the holder substrate 11, in a manner integrated with or separated from the cylindrical insulating member.

Formed in the holder substrate 11 (the first substrate 6, the second substrate 7) and the insulating members 13, 14 is a stab 30 having an opening connected to the first opening 8, and extending in a direction perpendicular to the penetrating direction of the first opening 8. The stab 30 forms a disk-like hollow space defined by a first cutout 30a provided on a surface of the first substrate 6 and the insulating member 14, and by a second cutout 30b provided on a surface of the second substrate 7 and the insulating member 13, these surfaces being those that face each other when the first substrate 6 and the second substrate 7 are stacked on top of each other.

Figure 3:
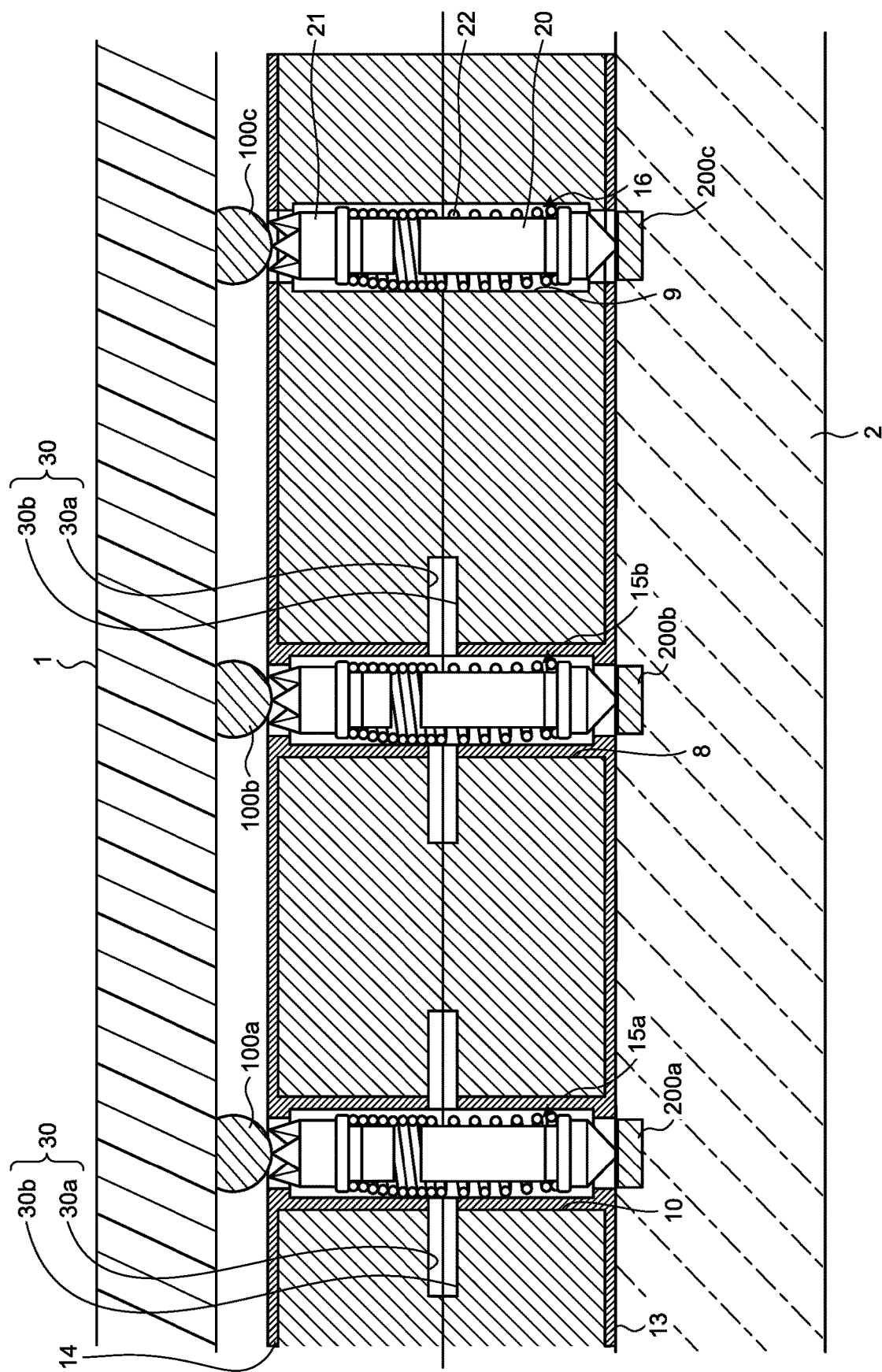
FIG. 3 is a schematic illustrating electrical interactions between the conductive contactors and the conductive contactor holder when the conductive contactor unit according to the first embodiment of the present invention is in use.

Explained now are electrical interactions between the conductive contactors and the conductive contactor holder 3 in the conductive contactor unit according to the first embodiment, while the semiconductor integrated circuit is being tested. FIG. 3 is a schematic illustrating electrical interactions between the conductive contactors 4 and the conductive contactor holder 3 when the conductive contactor unit according to the first embodiment is in use. To make it easier to explain advantages of the conductive contactor unit, a structure in which a signal conductive contactor 15a and a signal conductive contactor 15b are positioned adjacently to each other is illustrated in FIG. 3.

To being with, electric actions in the ground conductive contactor 16 will be explained. The ground conductive contactor 16 in the first embodiment is configured not only to supply a potential from the circuit board 2 to the semiconductor integrated circuit 1 via electrodes 100c, 200c, but also to supply a ground potential to the semiconductor integrated circuit 1 by receiving the potential from the holder substrate 11. In other words, as also illustrated in FIG. 2, the holder substrate 11 has no insulating member provided on the inner surface of the second opening 9 where the ground conductive contactor 16 is housed, and the inner surface of the second opening 9 is brought into direct contact with the outer circumferential surface of the ground conductive contactor 16, more specifically, with the spring member 22 having become warped as the spring member 22 contracts, as illustrated in FIG. 3. Because the holder substrate 11 is made of a conductive material, as mentioned earlier, the ground conductive contactor 16 becomes electrically connected to the holder substrate 11. Because this structure enables the internal charge to move back and forth between the ground conductive contactor 16 and the holder substrate 11, the potential to be supplied by the ground conductive contactor 16 becomes equal to the potential of the holder substrate 11.

Electric actions in the signal conductive contactor 15a, 15b will now be explained. The signal conductive contactors 15a, 15b receive electric signals generated by the circuit board 2 via electrodes 200a, 200b, respectively, and output and input the received electric signals to and from the semiconductor integrated circuit 1 via electrodes 100a, 100b, respectively.

Electric actions in the power-supplying conductive contactor 17 will now be explained. The power-supplying conductive contactor 17, although not illustrated in FIG. 4, receives power to be supplied, generated by the circuit board 2, via an electrode on the circuit board 2, and inputs and outputs the received power to and from the semiconductor integrated circuit 1 via an electrode on the semiconductor integrated circuit 1.

Figure 4:
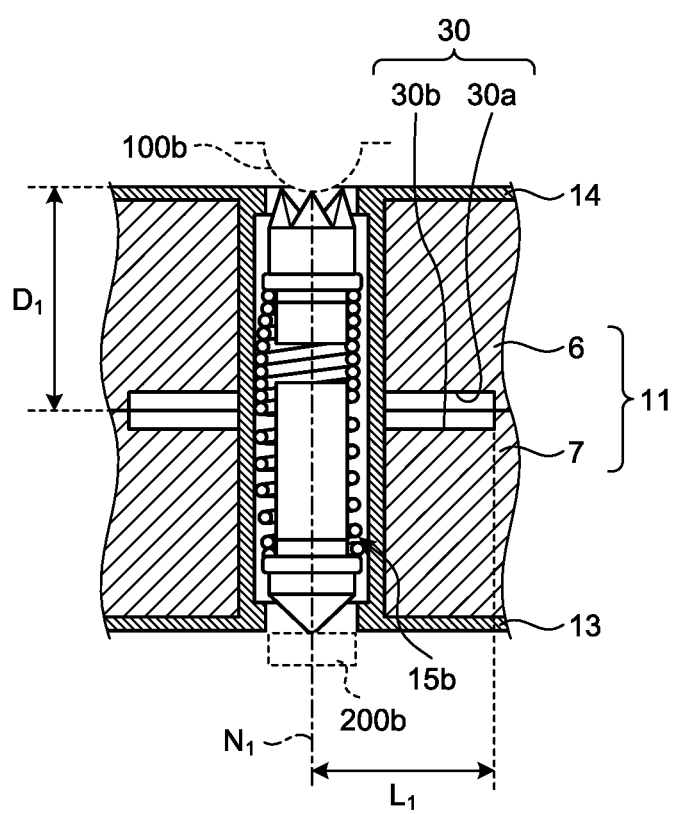
FIG. 4 is a sectional view illustrating a relevant portion of a conductive contactor holder included in the conductive contactor unit according to the first embodiment of the present invention.

FIG. 4 is a sectional view illustrating a relevant portion of the conductive contactor holder included in the conductive contactor unit according to the first embodiment of the present invention. FIG. 4 illustrates the configuration of the signal conductive contactor 15 and a part near the first opening 8 during a test. In the stab 30, as illustrated in FIG. 4, denoting the length between the tip of the signal conductive contactor 15 and the center of the stab 30 in the direction of the central axis $N_1$ (in this example, and the surface where the first substrate 6 and the second substrate 7 meet each other) during the signal inputs and outputs (during a test; see FIG. 3) as $D_1$, and denoting the length by which the stab 30 extends from the central axis $N_1$ of the first opening 8 in a direction perpendicular to the direction of the central axis $N_1$ of the first opening 8 (penetrating direction) as $L_1$, the length $D_1$ and the length $L_1$ can be obtained from following Equations (1) and (2), respectively. The central axis $N_1$ of the first opening 8 is matched with the central axis of a holding hole formed by the insulating members 13, 14 on the inner circumference of the first opening 8.

$$D_1 = \tan^{-1} \frac{1}{A_{SRW}} \times \frac{\lambda}{2\pi} \quad (1)$$

$$L_1 = \tan^{-1} \frac{A_{SRW} - 1}{A_{SRW}} \times \frac{\lambda}{2\pi} \quad (2)$$

In these equations, $A_{SRW}$ is a standing wave ratio ($A_{SRW}=Z_0/Z_a$, where $Z_0$ is a characteristic impedance, and $Z_a$ is a pure resistance ($<Z_0$). $\overline{A_{SRW}}$ (with a line on top thereof) is a conjugate complex number of $A_{SRW}$, and $\lambda$ is the wavelength of the resonance frequency.

The resonance frequency is a frequency at which a resonance occurs within the frequency range used when the semiconductor integrated circuit 1 that is a device under test is operated, for example. It is also possible to set a frequency other than the resonance frequency.

By providing the stab 30 extending by the length $L_1$ calculated from Equation (2) at the position corresponding to the length $D_1$ calculated from Equation (1), the stab 30 is enabled to serve as a matching circuit at the particular frequency, and therefore, it is possible to attenuate the standing wave, and to reduce the insertion loss. The particular frequency herein is a frequency for which the insertion loss is to be reduced within the range used, and, in particular, because the insertion loss increases locally at a frequency where the resonance occurs, the reduction of the insertion loss with the use of the present invention achieves a significant advantageous effect.

In the first embodiment described above, in the conductive contactor holder 3 in which the conductive contactors are housed, the stab 30 is provided to the first opening 8 where the signal conductive contactor 15 is housed. According to the first embodiment, by providing the stab 30 at the position where the standing wave at a particular frequency is to be attenuated within the frequency range in use, it is possible to reduce the insertion loss in the particular frequency range, when the signal conductive contactor 15 is used.

Furthermore, in the first embodiment, by using the holder substrate 11 made of a conductive material as the base material of the conductive contactor holder 3 in which the conductive contactors are housed, the efficiency of the ground-potential supplying function of the ground conductive contactor 16 can be improved, and the holder substrate 11 can also achieve a function for shielding electromagnetic waves related to the signal conductive contactor 15 and the power-supplying conductive contactor 17. Because these functions are largely dependent on the potential stability of the holder substrate 11, the ground-potential supplying function and the electromagnetic wave shielding function can be improved by improving the potential stability of the holder substrate 11.

First Modification of First Embodiment

Figure 5:
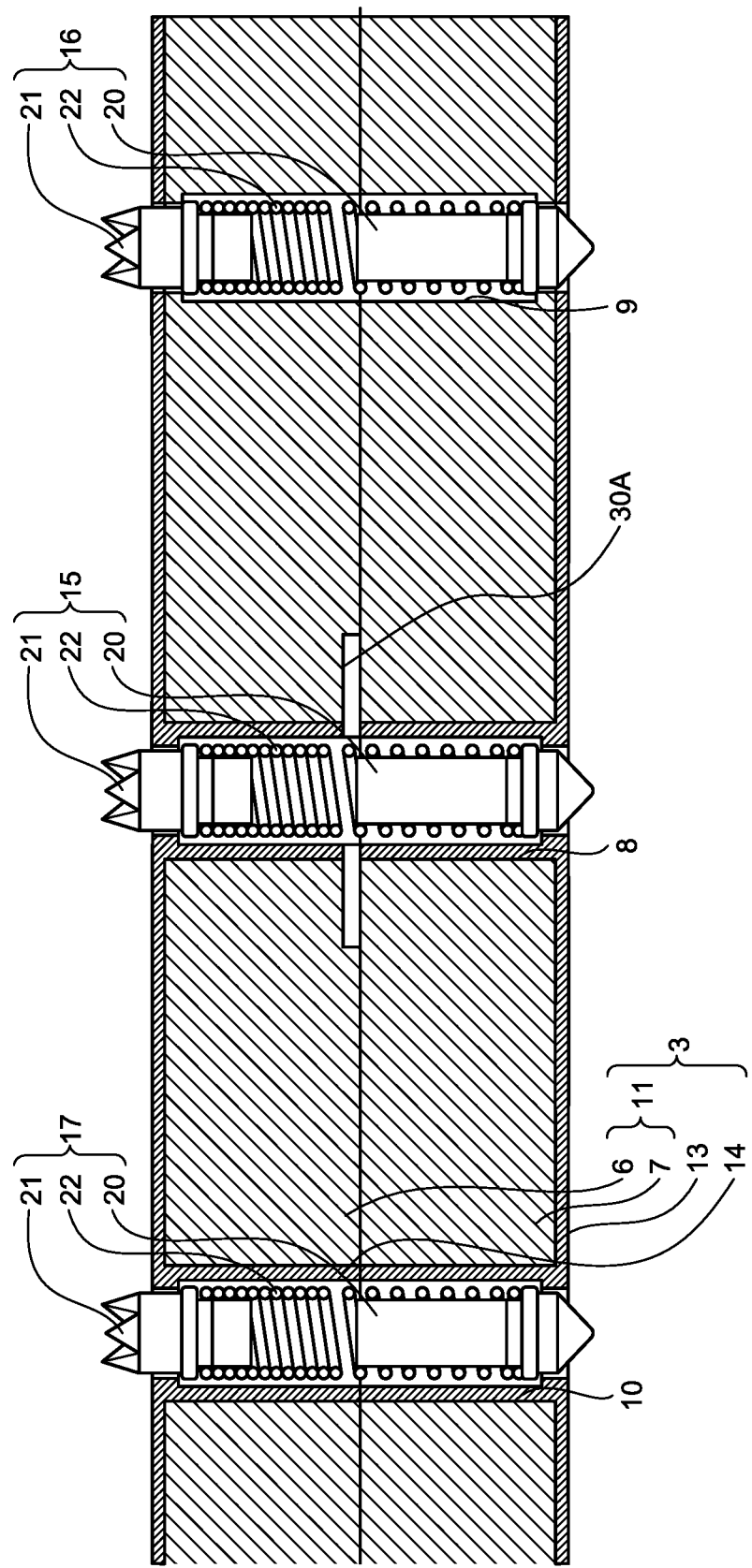
FIG. 5 is a partial sectional view illustrating a detailed structure of a conductive contactor holder and conductive contactors included in a conductive contactor unit according to a first modification of the first embodiment of the present invention.

FIG. 5 is a partial sectional view illustrating a detailed structure of a conductive contactor holder and conductive contactors included in a conductive contactor unit according to a first modification of the first embodiment of the present invention. In the first embodiment described above, the stab 30 is formed by the cutouts 30a, 30b that are provided to the first substrate 6 and the second substrate 7 making up the holder substrate 11, but the embodiment is not limited thereto. As illustrated in FIG. 5, the stab may be a stab 30A formed by a cutout provided only on the first substrate 6. In this manner, it is also possible to provide the stab to one of the first substrate 6 and the second substrate 7 making up the holder substrate 11.

Second Modification of First Embodiment

Figure 6:
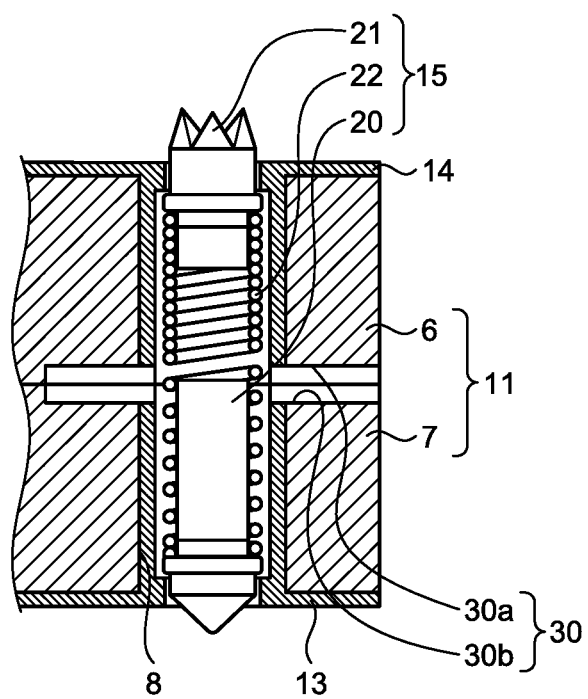
FIG. 6 is a partial sectional view illustrating a detailed structure of a conductive contactor holder and a conductive contactor included in a conductive contactor unit according to a second modification of the first embodiment of the present invention.

FIG. 6 is a partial sectional view illustrating a detailed structure of a conductive contactor holder and a conductive contactor included in a conductive contactor unit according to a second modification of the first embodiment of the present invention. Explained in the first embodiment described above is an example in which the stab 30 has one end connected to the first opening 8, and has the other end closed (what is called a short stab), but the embodiment is not limited thereto. It is also possible for the stab to be an open stab where the other end of the stab 30 reaches the outer surface of the holder substrate 11, as illustrated in FIG. 6.

Third Modification of First Embodiment

Figure 7:
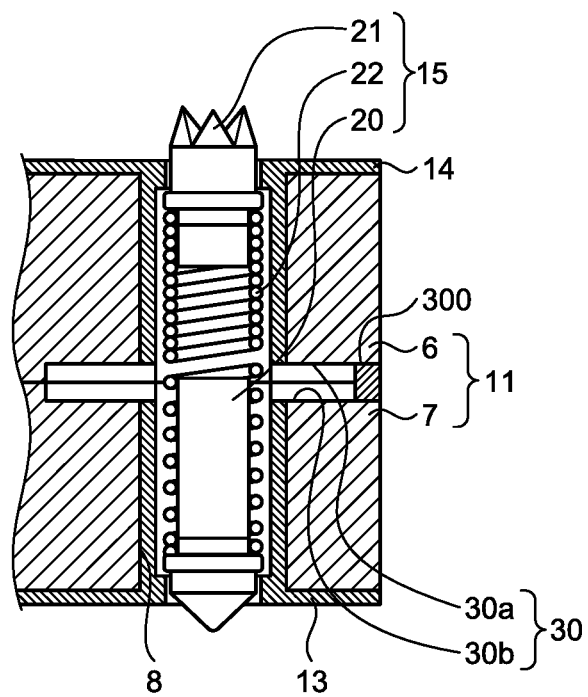
FIG. 7 is a partial sectional view illustrating a detailed structure of a conductive contactor holder and a conductive contactor included in a conductive contactor unit according to a third modification of the first embodiment of the present invention.

FIG. 7 is a partial sectional view illustrating a detailed structure of a conductive contactor holder and a conductive contactor included in a conductive contactor unit according to a third modification of the first embodiment of the present invention. It is also possible to form a short stab by inserting an adjustment member to the open stab according to the second modification described above, from the side of the outer surface of the holder substrate 11, so that the one end of the open stab is sealed thereby. Specifically, by using an adjustment member 300 illustrated in FIG. 7, it is possible to adjust the length $L_1$ of the stab 30 described above.

Fourth Modification of First Embodiment

Figure 8:
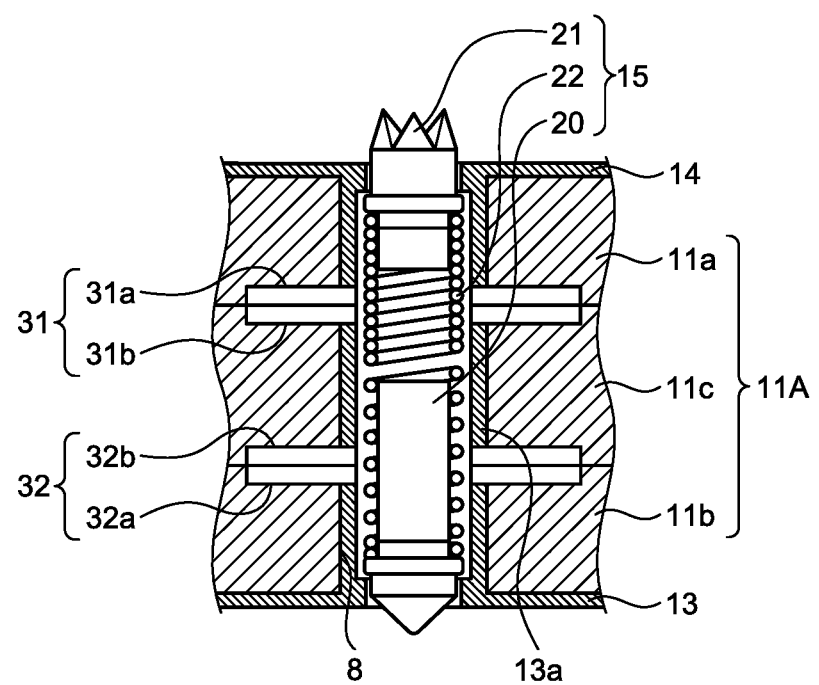
FIG. 8 is a partial sectional view illustrating a detailed structure of a conductive contactor holder and a conductive contactor included in a conductive contactor unit according to a fourth modification of the first embodiment of the present invention.

FIG. 8 is a partial sectional view illustrating a detailed structure of a conductive contactor holder and a conductive contactor included in a conductive contactor unit according to a fourth modification of the first embodiment of the present invention. The first embodiment described above has been explained assuming that there is one stab 30 provided in the penetrating direction of the first opening 8, but the embodiment is not limited thereto. As illustrated in FIG. 8, it is also possible to provide a plurality of (two, in FIG. 8) stabs (stabs 31, 32) in the penetrating direction of the first opening 8. With this configuration, a holder substrate 11A includes three substrates (a first substrate 11a, a second substrate 11b, and a third substrate 11c), and an insulating member 13a is provided on a surface of the middle substrate (the third substrate 11c) in the stacking direction. In this manner, the stab may be provided in plurality, depending on the frequency to be attenuated.

Second Embodiment

Figure 9:
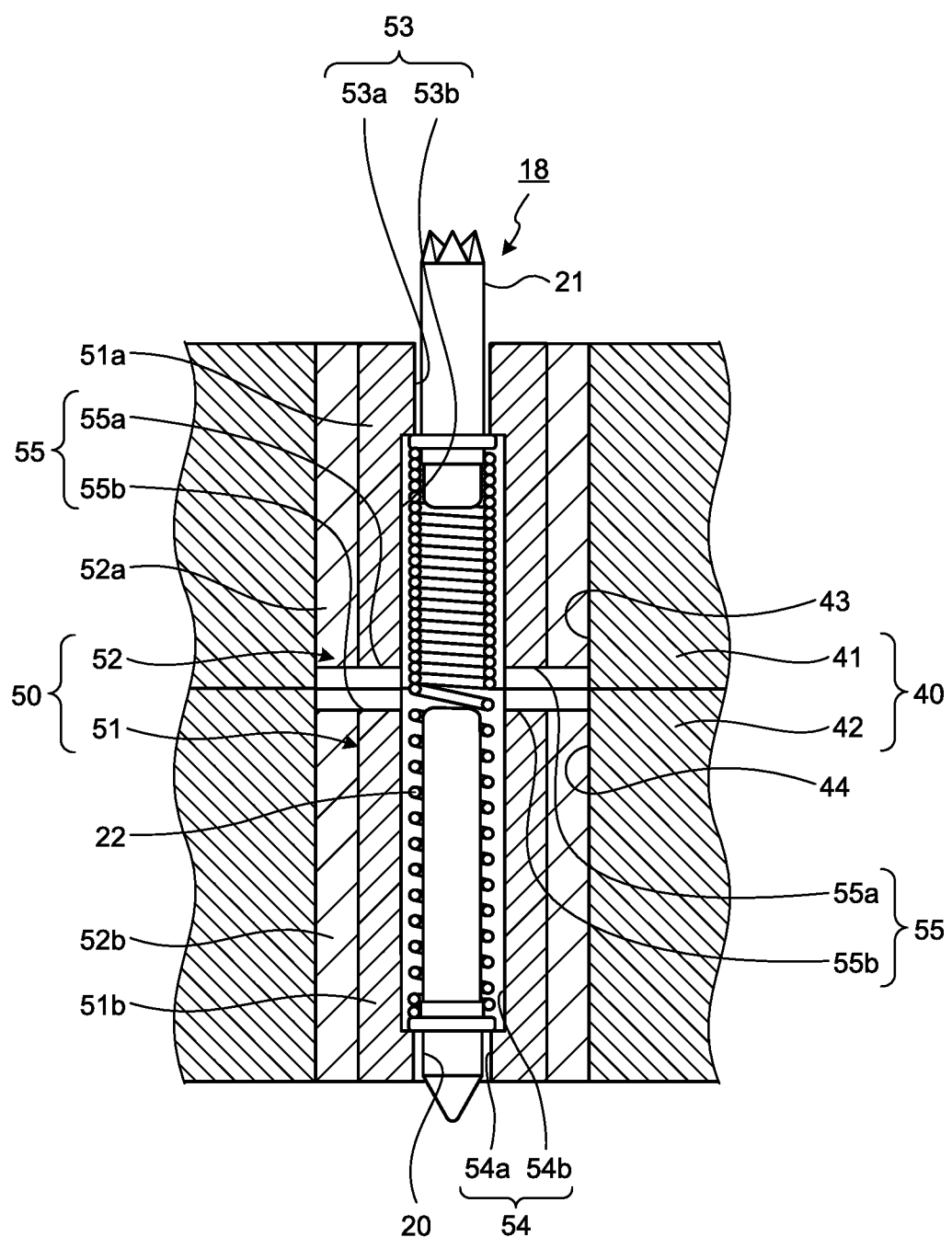
FIG. 9 is a partial sectional view illustrating a detailed structure of a conductive contactor holder and a conductive contactor included in a conductive contactor unit according to a second embodiment of the present invention.

FIG. 9 is a partial sectional view illustrating a detailed structure of a conductive contactor holder and a conductive contactor included in a conductive contactor unit according to a second embodiment of the present invention. Explained in the first embodiment described above is a conductive contactor holder in which the holder substrate 11 is made of a metallic material, and the insulating members 13, 14 provided on the outer surface of the holder substrate 11, but, in the second embodiment, the holder substrate is made of an insulating material.

The conductive contactor unit illustrated in FIG. 9 includes a signal conductive contactor 18 having both ends thereof, in the longitudinal direction, brought into contact with the semiconductor integrated circuit 1 and the circuit board 2, respectively, which are two different objects to be brought into contact with, and a conductive contactor holder 40 that houses and holds the conductive contactors 18 in a predetermined pattern. The structures of the conductive contactors 18 are the same as those of the signal conductive contactor 15 described above.

The conductive contactor holder 40 is made of an insulating material such as resin, machinable ceramic, or silicone, or is made of a stack of a first substrate 41 positioned on the top surface side and a second substrate 42 positioned on the side of the bottom surface side, in FIG. 9. The first substrate 41 and the second substrate 42 have the same number of openings 43 and 44 in which the conductive contactors 18 are inserted, respectively. The openings 43 and 44 are provided in such a manner that the axial line of one of these openings is matched with that of the other. The positions where the openings 43 and 44 are provided are determined based on the wiring pattern of the semiconductor integrated circuit 1.

A holding member 50 for holding a conductive contactor is housed inside of the openings 43 and 44. The holding member 50 includes a tubular insulating pipe 51 through which the conductive contactor 18 is passed, and a conductive pipe 52 that is provided on the outer circumference of the insulating pipe 51.

The insulating pipe 51 is made of an insulating material such as fluorine-based resin (such as polytetrafluoroethylene), and is made of a stack of a first member 51a positioned on the top surface side, and a second member 51b positioned on the bottom surface side in FIG. 9. The first member 51a and the second member 51b have holder holes 53 and 54, respectively, in which the conductive contactor 18 is housed. The holder holes 53, 54, in which the signal conductive contactor 15 is housed, are formed in such a manner that the axial line of one of these holder holes 53, 54 is matched with that of the other.

The holder holes 53 and 54 are holes each having a stepped shape, with different diameters in the penetrating direction. In other words, the holder hole 53 has a small diameter portion 53a having an opening on the top end side of the conductive contactor holder 40, and a large diameter portion 53b having a diameter larger than the small diameter portion 53a. The holder hole 54 has a small diameter portion 54a having an opening on the bottom end side of the conductive contactor holder 40, and a large diameter portion 54b having a diameter larger than the small diameter portion 54a. The shapes of these holder holes 53 and 54 are determined based on the structure of the conductive contactor 18 that is to be housed therein. The flange portion of the needle-like member 20 has a function for preventing the conductive contactor 18 from coming out from the conductive contactor holder 40, by being brought into abutment against the wall surface at the boundary between the small diameter portion 54a and the large diameter portion 54b of the holder hole 54. The flange portion of the needle-like member 21 has a function for preventing the conductive contactor 18 from coming out from the conductive contactor holder 40, by being brought into abutment against the wall surface at the boundary between the small diameter portion 53a and the large diameter portion 53b of the holder hole 53.

The conductive pipe 52 is made of a conductive material such as copper, silver, and alloy or plating containing copper or silver as a main component. The conductive pipe 52 includes a first member 52a that covers the outer circumference of the first member 51a of the insulating pipe 51 and a second member 52b that covers the outer circumference of the second member 51b of the insulating pipe 51, and covers the outer circumferential surface of the insulating pipe 51. The conductive pipe 52 is brought into contact with the ground electrodes of the semiconductor integrated circuit 1 and the circuit board 2.

The holding member 50 (the insulating pipe 51, the conductive pipe 52) has a stab 55 forming an opening connected to the holder holes 53, 54, and extending in a direction perpendicular to the penetrating direction of the holder holes 53, 54. The stab 55 forms a disk-like hollow space defined by a first cutout 55a provided on a surface of the first member 51a, and by a second cutout 55b provided on the second member 51b, these surfaces being those that face each other when the first member 51a and the second member 51b are stacked on top of each other. The position where the stab 55 is provided, and the length of the stab 55 in the extending direction of the stab 55 can be obtained from Equations (1) and (2), respectively, that are mentioned above.

According to the second embodiment described above, in the conductive contactor holder 40 in which the conductive contactors are housed, the stab 55 is provided to the holding member 50 in which the conductive contactors 18 are housed. According to the second embodiment, by providing the stab 55 at a position where the standing wave is attenuated, within the frequency range in use, the insertion loss in the predetermined frequency range can be reduced when the conductive contactors 18 are used.

It is also possible to use the structure according to the second embodiment described above to the power-supplying conductive contactor 17.

Furthermore, explained in the second embodiment described above is an example in which each of the insulating pipe 51 and the conductive pipe 52 in the holding member 50 includes two members (first and second members), but the insulating pipes may be integrated, with a part of the first member connected to a part of the second member. With this structure, the hollow space formed by the stab may be a non-disk-like shape, for example.

Third Embodiment

Figure 10:
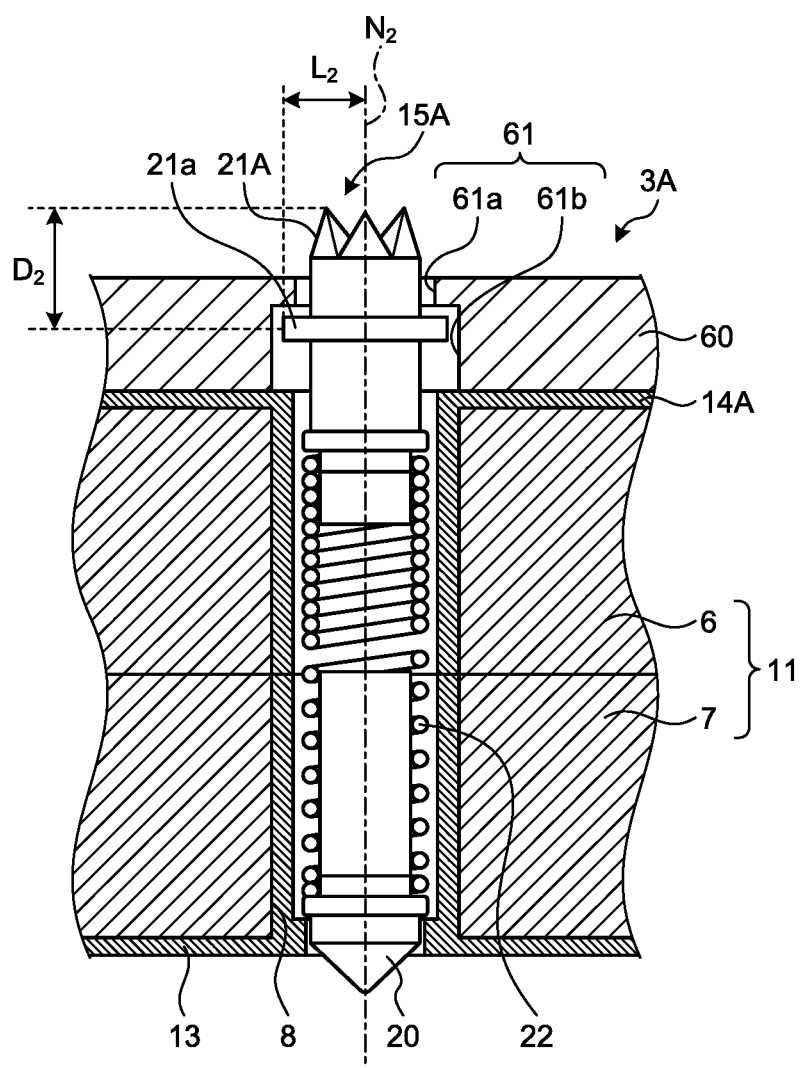
FIG. 10 is a partial sectional view illustrating a detailed structure of a conductive contactor holder and a conductive contactor included in a conductive contactor unit according to a third embodiment of the present invention.

FIG. 10 is a partial sectional view illustrating a detailed structure of a conductive contactor holder and a conductive contactor included in a conductive contactor unit according to a third embodiment of the present invention. Explained in the first and the second embodiment described above is an example in which the stab is provided to the conductive contactor holder, but, in the third embodiment, the stab is provided to the conductive contactors.

The conductive contactor unit according to the third embodiment includes the circuit board 2 that is described above (not illustrated), a conductive contactor holder 3A that is placed on the circuit board 2, and that has predetermined openings, and conductive contactors (a signal conductive contactor 15A, the ground conductive contactor 16, and the power-supplying conductive contactor 17) that are housed in the respective openings of the conductive contactor holder 3A.

The signal conductive contactor 15A according to the third embodiment includes the needle-like member 20 that is to be electrically connected to the electrode provided to the circuit board 2, a needle-like member 21A that is to be electrically connected to the connecting electrode provided to the semiconductor integrated circuit 1 during the use, and the spring member 22 that is provided between the needle-like member 20 and the needle-like member 21A, that electrically connects the needle-like members 20, 21A, and that allows the signal conductive contactor 15A to extend and to contract along the long-axis direction. The needle-like member 20 and the spring member 22 have the same structures as those in the signal conductive contactor 15 described above.

The needle-like member 21A has a stab 21a at the center of the needle-like member 21A in the direction of the central axis $N_2$. The stab 21a has a disk-like shape protruding from the needle-like member 21A in the direction perpendicular to the longitudinal direction of the needle-like member 21A. As illustrated in FIG. 10, denoting the length between the tip of the needle-like member 21A and the center of the stab 21a in the direction of the central axis $N_2$ as $D_2$, and denoting the length by which the stab 21a extends from the central axis $N_2$ of the needle-like member 21A in the direction perpendicular to the direction of the central axis $N_2$ of the needle-like member 21A (penetrating direction) as $L_2$, the lengths $D_2$, $L_2$ can be calculated using following Equations (3) and (4), respectively.

$$D_2 = \tan^{-1} \overline{B_{SRW}} \times \frac{\lambda}{2\pi} \quad (3)$$

$$L_2 = \tan^{-1} \frac{\overline{B_{SRW}}}{B_{SRW} - 1} \times \frac{\lambda}{2\pi} \quad (4)$$

In these equations, $B_{SRW}$ is a standing wave ratio ($B_{SRW}=Z_a/Z_0$, where $Z_0$ is a characteristic impedance, and $Z_a$ is a pure resistance (>$Z_0$). $\overline{B_{SRW}}$ (with a line on top thereof) is a conjugate complex number of $B_{SRW}$, and $\lambda$ is the wavelength of the resonance frequency.

The resonance frequency is a frequency at which a resonance occurs within the frequency range used when the semiconductor integrated circuit 1 that is a device under test is to be operated, for example, in the same manner as in the first embodiment. It is also possible to set a frequency other than the resonance frequency.

The conductive contactor holder 3A includes the holder substrate 11 including the first substrate 6 and the second substrate 7 described above, the insulating member 13 and an insulating member 14A covering the inner surface of the first opening 8 and the third opening 10, and also covering the surface of the holder substrate 11, and a holding plate 60 provided on the side of the insulating member 14A, and housing and holding a part of the needle-like member 21A. The insulating member 14A has a hole having a constant diameter in the first opening 8.

The holding plate 60 has holes communicating with the first opening 8, the second opening 9, and the third opening 10, respectively. A hole 61 for holding the signal conductive contactor 15A will now be explained. As illustrated in FIG. 10, the hole 61 has a stepped shape, with different diameters in the penetrating direction. The hole 61 has a small diameter portion 61a opening to the top end surface of the conductive contactor holder 3A, and a large diameter portion 61b having a diameter larger than the small diameter portion 61a. The shape of the hole 61 is determined based on the structure of the signal conductive contactor 15A that is to be housed therein. For example, the length of the large diameter portion 61b in the penetrating direction is set larger than the distance by which the stab 21a moves (stroke) during the test. In this manner, it is possible to prevent the holding plate 60 from limiting the stroke of the needle-like member 21A.

In the third embodiment, while the stepped portion formed by the small diameter portion 61a and the large diameter portion 61b serves as a stopper of the stab 21a, the stepped portion formed by the insulating member 13 serves as a stopper of the flange of the needle-like member 20. In this manner, the signal conductive contactor 15A is prevented from coming out from the conductive contactor holder 3A.

The holes for holding the ground conductive contactor 16 and the power-supplying conductive contactor 17 may have the same shape as the hole 61, or may be a hollow space having a columnar shape extending at the same diameter.

In the third embodiment described above, the stab 21a is provided to the needle-like member 21A of the signal conductive contactor 15A. According to the third embodiment, by providing the stab 21a at the position where the standing wave is attenuated in the frequency range in use, it is possible to reduce the insertion loss in the particular frequency range when the signal conductive contactor 15A is used.

First Modification of Third Embodiment

Figure 11:
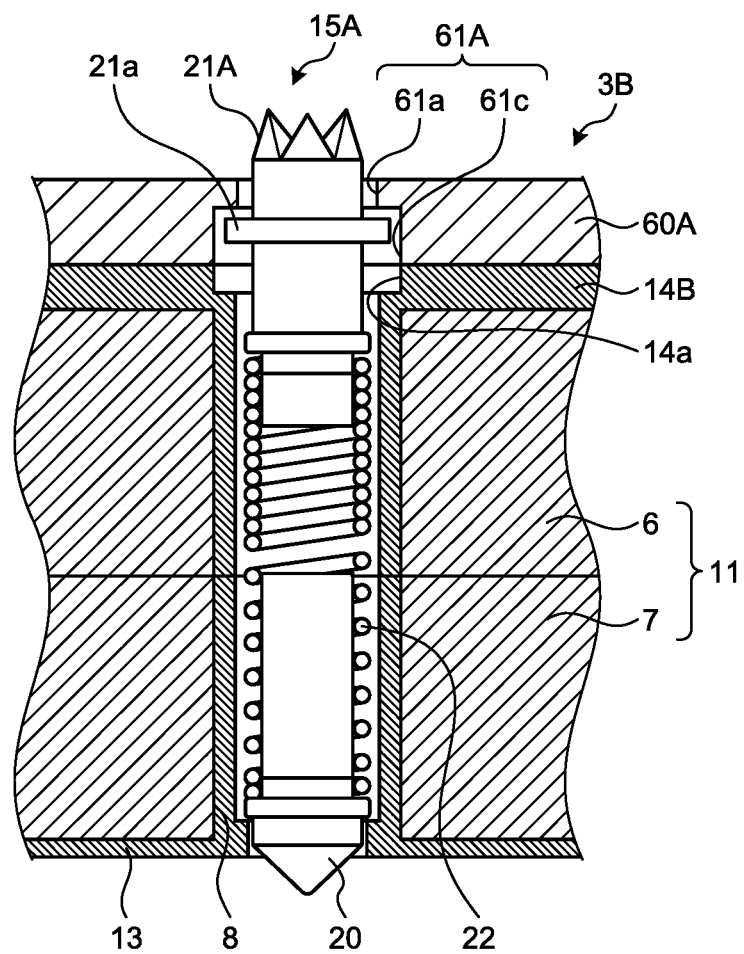
FIG. 11 is a partial sectional view illustrating a detailed structure of a conductive contactor holder and a conductive contactor included in a conductive contactor unit according to a first modification of the third embodiment of the present invention.

FIG. 11 is a partial sectional view illustrating a detailed structure of a conductive contactor holder and a conductive contactor included in a conductive contactor unit according to a first modification of the third embodiment of the present invention. Explained in the third embodiment described above is an example in which the stab 21a ensures the stroke of the needle-like member 21A merely with the large diameter portion 61b of the holding plate 60, but the embodiment is not limited thereto. In the first modification, the stroke of the needle-like member 21A is ensured by a hole formed by a holding plate 60A and an insulating member 14B.

A conductive contactor unit according to the first modification includes the circuit board 2 that is described above (not illustrated), a conductive contactor holder 3B that is placed on the circuit board 2, and that has predetermined openings, and conductive contactors (the signal conductive contactor 15A, the ground conductive contactor 16, power-supplying conductive contactor 17) that are housed in the respective openings of the conductive contactor holder 3B.

The conductive contactor holder 3B includes the holder substrate 11 including the first substrate 6 and the second substrate 7 described above, the insulating member 13 and the insulating member 14B covering the inner surface of the first opening 8 and the third opening 10, and also covering the surface of the holder substrate 11, and the holding plate 60A provided on the side of the insulating member 14B, and housing and holding a part of the needle-like member 21A.

The holding plate 60A has holes communicating with the first opening 8, the second opening 9, and the third opening 10, respectively. A hole 61A for holding the signal conductive contactor 15A will now be explained. As illustrated in FIG. 11, the hole 61A has a stepped shape, with different diameters in the penetrating direction. The hole 61A has the small diameter portion 61a opening to the top end surface of the conductive contactor holder 3B, and a large diameter portion 61c having a diameter larger than the small diameter portion 61a.

In this first modification, too, the stepped portion formed by the small diameter portion 61a and the large diameter portion 61c serves as a stopper of the stab 21a. In this manner, the signal conductive contactor 15A is prevented from coming out from the conductive contactor holder 3B.

The insulating member 14A also has a large diameter portion 14a that is continuous to the large diameter portion 61c, and that has the same diameter as the large diameter portion 61c.

The shapes of the large diameter portions 14a, 61c are determined based on the structure of the signal conductive contactor 15A that is to be housed therein. For example, the length of the large diameter portions 14a, 61c in the penetrating direction is set larger than the distance by which the stab 21a moves (the stroke) during the test. In this manner, it is possible to prevent the holding plate 60A from limiting the stroke of the needle-like member 21A.

Second Modification of Third Embodiment

Figure 12:
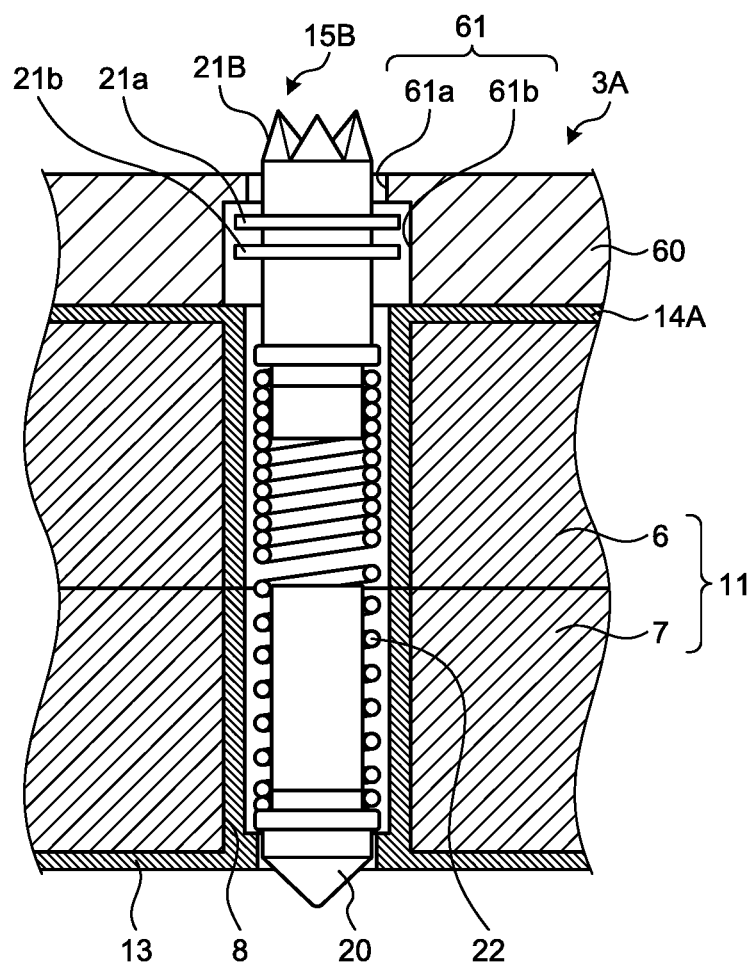
FIG. 12 is a partial sectional view illustrating a detailed structure of a conductive contactor holder and a conductive contactor included in a conductive contactor unit according to a second modification of the third embodiment of the present invention.

FIG. 12 is a partial sectional view illustrating a detailed structure of a conductive contactor holder and a conductive contactor included in a conductive contactor unit according to a second modification of the third embodiment of the present invention. Explained in the third embodiment described above is an example in which there is one stab 21a provided to the needle-like member 21A, but the embodiment is not limited thereto. In the second modification, a needle-like member 21B is provided with two stabs (stabs 21a, 21b).

The conductive contactor unit according to the second modification includes the circuit board 2 that is described above (not illustrated), the conductive contactor holder 3A that is placed on the circuit board 2, and that has predetermined openings, and conductive contactors (a signal conductive contactor 15B, the ground conductive contactor 16, and the power-supplying conductive contactor 17) that are housed in the respective openings of the conductive contactor holder 3A.

The signal conductive contactor 15B according to the second modification includes the needle-like member 20 that is to be electrically connected to the electrode provided to the circuit board 2, a needle-like member 21B that is to be electrically connected to the connecting electrode provided to the semiconductor integrated circuit 1 during the use, and the spring member 22 that is provided between the needle-like member 20 and the needle-like member 21B, that electrically connects the needle-like members 20, 21B, and that allows the signal conductive contactor 15B to extend and to contract along the long-axis direction. The needle-like member 20 and the spring member 22 have the same structures as those in the signal conductive contactor 15 described above.

The needle-like member 21B is provided with two stabs (the stabs 21a, 21b) along the central axis direction of the needle-like member 21B. The stabs 21a, 21b protrude from the needle-like member 21B in the direction perpendicular to the longitudinal direction of the needle-like member. Each of the stabs 21a, 21b is provided so that the standing wave at a particular frequency is attenuated. The lengths by which the stabs 21a, 21b protrude, and the positions where the stabs 21a, 21b are provided can be obtained from above Equations (3) and (4), respectively, for example.

Third Modification of Third Embodiment

Figure 13:
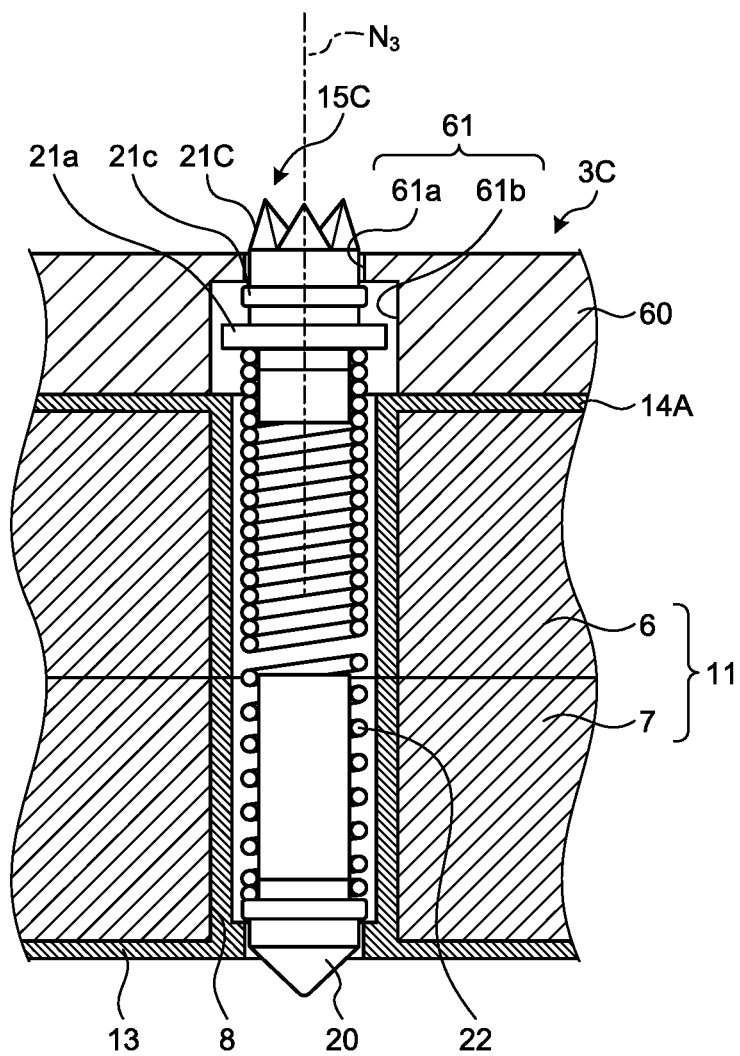
FIG. 13 is a partial sectional view illustrating a detailed structure of a conductive contactor holder and a conductive contactor included in a conductive contactor unit according to a third modification of the third embodiment of the present invention.

FIG. 13 is a partial sectional view illustrating a detailed structure of a conductive contactor holder and a conductive contactor included in a conductive contactor unit according to a third modification of the third embodiment of the present invention. Explained in the third embodiment described above is an example in which the stab 21a is provided on the tip side of the needle-like member 21A with respect to the flange portion, and the stab has a function for preventing the needle-like member 21A from coming out (see FIG. 10), but the embodiment is not limited thereto. In the third modification, the needle-like member 21C has the stab 21a provided on the base end side with respect to the flange portion 21c (on the side of the spring member 22).

The conductive contactor unit according to the third modification includes the circuit board 2 that is described above (not illustrated), a conductive contactor holder 3C that is placed on the circuit board 2, and that has predetermined openings, and conductive contactors (a signal conductive contactor 15C, the ground conductive contactor 16, and the power-supplying conductive contactor 17) that are housed in the respective openings of the conductive contactor holder 3C.

The signal conductive contactor 15C according to the third modification includes the needle-like member 20 that is to be electrically connected to the electrode provided to the circuit board 2, a needle-like member 21C that is to be electrically connected to the connecting electrode provided to the semiconductor integrated circuit 1 during the use, and the spring member 22 that is provided between the needle-like member 20 and the needle-like member 21C, that electrically connects the needle-like members 20, 21C, and that allows the signal conductive contactor 15C to extend and to contract along the long-axis direction. The needle-like member 20 and the spring member 22 have the same structures as those in the signal conductive contactor 15 described above.

The needle-like member 21C is provided with the stab 21a and the flange portion 21c along the direction of a central axis N₃ of the needle-like member 21C. The stab 21a is provided on the base end side, with respect to the flange portion 21c.

In the conductive contactor holder 3C, the flange portion 21c of the needle-like member 21C can be brought into abutment against the wall surface at the boundary between the small diameter portion 61a and the large diameter portion 61b of the hole 61. In this manner, the signal conductive contactor 15C is prevented from coming out from the conductive contactor holder 3B.

Fourth Modification of Third Embodiment

Figure 14:
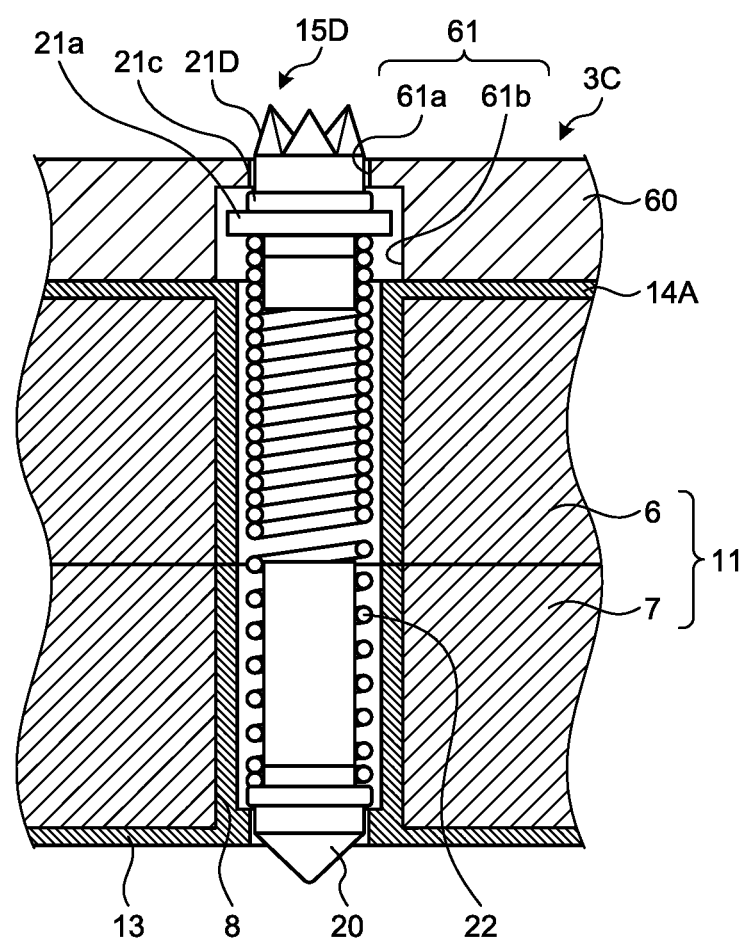
FIG. 14 is a partial sectional view illustrating a detailed structure of a conductive contactor holder and a conductive contactor included in a conductive contactor unit according to a fourth modification of the third embodiment of the present invention.

FIG. 14 is a partial sectional view illustrating a detailed structure of a conductive contactor holder and a conductive contactor included in a conductive contactor unit according to a fourth modification of the third embodiment of the present invention. Explained in the third modification described above is an example in which the stab 21a and the flange portion 21c are separated from each other, but the flange portion 21c and the stab 21a may be in contact with each other, depending on the frequency for which the standing wave is to be attenuated.

The conductive contactor unit according to the fourth modification includes the circuit board 2 that is described above (not illustrated), a conductive contactor holder 30 that is placed on the circuit board 2, and that has predetermined openings, and conductive contactors (a signal conductive contactor 15D, the ground conductive contactor 16, and the power-supplying conductive contactor 17) that are housed in the respective openings of the conductive contactor holder 3C.

The signal conductive contactor 15C according to the fourth modification includes the needle-like member 20 that is to be electrically connected to the electrode provided to the circuit board 2, a needle-like member 21D that is to be electrically connected to the connecting electrode provided to the semiconductor integrated circuit 1 during the use, and the spring member 22 that is provided between the needle-like member 20 and the needle-like member 21D, that electrically connects the needle-like members 20, 21D, and that allows the signal conductive contactor 15D to extend and to contract along the long-axis direction. The needle-like member 20 and the spring member 22 have the same structures as those in the signal conductive contactor 15 described above.

The needle-like member 21C is provided with the stab 21a and the flange portion 21c along the central axis direction of the needle-like member 21C. The stab 21a is provided on the base end side with respect to the flange portion 21c, and is in contact with the flange portion 21c.

Fifth Modification of Third Embodiment

Figure 15:
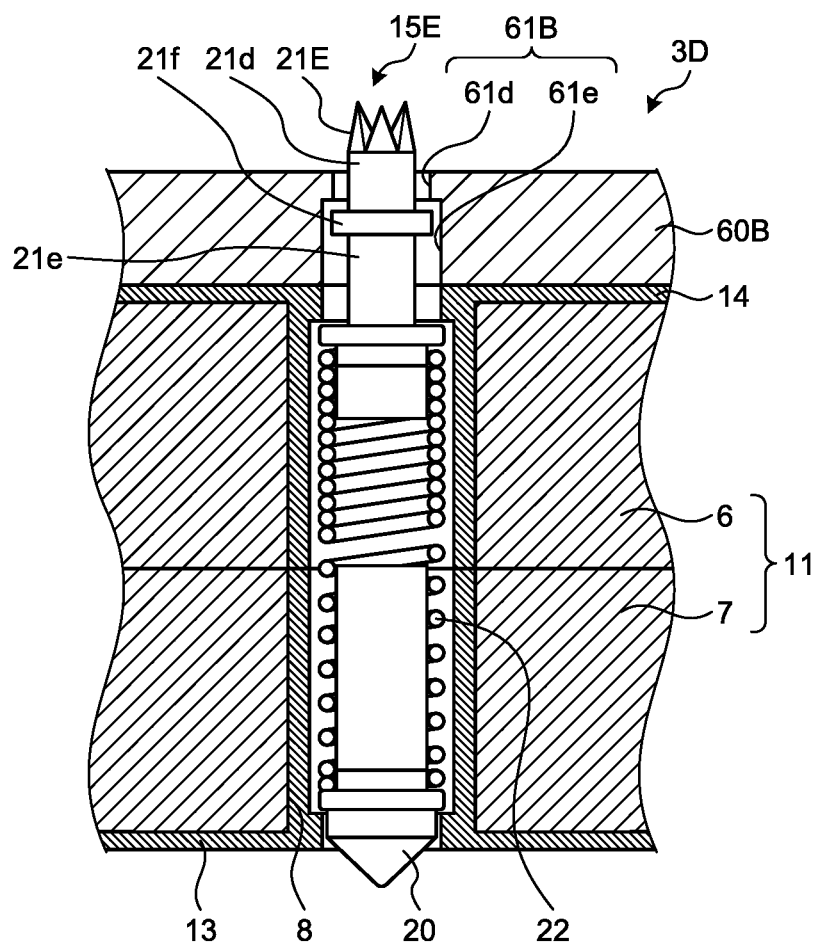
FIG. 15 is a partial sectional view illustrating a detailed structure of a conductive contactor holder and a conductive contactor included in a conductive contactor unit according to a fifth modification of the third embodiment of the present invention.

FIG. 15 is a partial sectional view illustrating a detailed structure of a conductive contactor holder and a conductive contactor included in a conductive contactor unit according to a fifth modification of the third embodiment of the present invention.

The conductive contactor unit according to the fifth modification includes the circuit board 2 that is described above (not illustrated), a conductive contactor holder 3D that is placed on the circuit board 2, and that has predetermined openings, and conductive contactors (a signal conductive contactor 15E, the ground conductive contactor 16, and the power-supplying conductive contactor 17) that are housed in the respective openings of the conductive contactor holder 3D.

The conductive contactor holder 3D includes the holder substrate 11 including the first substrate 6 and the second substrate 7 described above, the insulating member 13 and the insulating member 14 covering the inner surface of the first opening 8 and the third opening 10, and also covering the surface of the holder substrate 11, and a holding plate 60B provided on the side of the insulating member 14, and housing and holding a part of the needle-like member 21E.

The holding plate 60B has holes communicating with the first opening 8, the second opening 9, and the third opening 10, respectively. A hole 61B for holding the signal conductive contactor 15E will now be explained. As illustrated in FIG. 15, the hole 61B has a stepped shape, with different diameters in the penetrating direction. The hole 61B has a small diameter portion 61d opening to the top end surface of the conductive contactor holder 3D, and a large diameter portion 61e having a diameter larger than the small diameter portion 61d.

In the fifth modification, the stepped portion formed by the insulating member 14 serves as a stopper of the flange portion of the needle-like member 21E. In this manner, the signal conductive contactor 15E is prevented from coming out from the conductive contactor holder 3D.

The signal conductive contactor 15E includes the needle-like member 20 that is to be electrically connected to the electrode provided to the circuit board 2, the needle-like member 21E that is to be electrically connected to the connecting electrode provided to the semiconductor integrated circuit 1 during the use, and the spring member 22 that is provided between the needle-like member 20 and the needle-like member 21E, that electrically connects the needle-like members 20, 21E, and that allows the signal conductive contactor 15E to extend and to contract along the long-axis direction. The needle-like member 20 and the spring member 22 have the same structures as those in the signal conductive contactor 15 described above.

The needle-like member 21E has shaft portions 21d, 21e forming the shaft of the needle-like member 21E, and a stab 21f that is provided between the shaft portions 21d, 21e. The shaft portions 21d, 21e have the same diameter. The stab 21f has a disk-like shape protruding from the needle-like member 21E in the direction perpendicular to the central axis. It is possible to obtain the length (length $D_2$) between the tip of the needle-like member 21E and the center of the stab 21f in the direction of the central axis, and the length (length $L_2$) of the stab 21f extending from central axis of the needle-like member 21E in the direction perpendicular to the direction of the central axis of the needle-like member 21E (penetrating direction) using above Equations (3) and (4), respectively.

As a result of determining the length $L_2$ from Equation (4), if the length $L_2$ is the same as the diameter of the shaft portions 21d, 21e of the needle-like member 21E, or smaller than the diameter of the shaft portions 21d, 21e, the diameter of the shaft portions 21d, 21e may be set smaller.

With the structures according to the first to the fifth modifications described above, by providing a stab at a position where the standing wave is attenuated in the frequency range in use, it is possible to reduce the insertion loss in the particular frequency range when the signal conductive contactor 15A to 15D is used.

Explained in the third embodiment, and the first to the fifth modifications described above is an example in which a stab is provided to the needle-like members 21A to 21E that is to be electrically connected to the connecting electrode provided to the semiconductor integrated circuit 1 during the use, but it is also possible to provide the stab to the needle-like member 20 that is to be electrically connected to the electrode provided to the circuit board 2, or the stab may be provided to both of the needle-like member 20 and the needle-like members 21A to 21E.

Explained in the first to the third embodiments described above is an example in which the stab has a disk-like shape, but the stab may also have an elliptical shape, or may be a hole or a protrusion extending in a prism-like shape. As long as the stab attenuates the standing wave of the resonance frequency, the shape of the stab is not limited to a disk-like shape.

INDUSTRIAL APPLICABILITY

As described above, the conductive contactor unit according to the present invention is suitable for reducing the insertion loss at a particular frequency.

REFERENCE SIGNS LIST

1 semiconductor integrated circuit
2 circuit board
3, 3A, 3B, 3C, 40 conductive contactor holder
4, 18 conductive contactors
6 first substrate
7 second substrate
8 first opening
9 second opening
10 third opening
11 holder substrate
15, 15a, 15b, 15A, 15B, 15C, 15D, 15E signal conductive contactor
16 ground conductive contactor
17 power-supplying conductive contactor
20, 21, 21A, 21B, 21C, 21D, 21E needle-like member
22 spring member
13, 14, 14A, 14B insulating member
21a, 21b, 21f, 30, 30A, 55 stab
50 holding member
60 holding plate

The invention claimed is:

1. A conductive contactor unit comprising:
a signal conductive contactor configured to input or output a signal to or from a predetermined circuit structure, the signal conductive contactor including:
a first plunger configured to contact the predetermined circuit structure,
a second plunger connected to a circuit board configured to input or output the signal to or from the predetermined circuit structure, and
a spring member configured to connect the first plunger and the second plunger in an extendable and contractible manner; and
a conductive contactor holder configured to house the signal conductive contactor used for inputting and outputting the signal to and from the predetermined circuit structure, the conductive contactor holder having a coaxial structure with the signal conductive contactor, and including:
a holder substrate including an opening configured to allow the signal conductive contactor to be inserted therethrough,
a holding member housed in the opening, and including a holding hole configured to hold one or more of the signal conductive contactors, and
a stab configured to form a hollow space extending from the holding hole in a direction perpendicular to a central axis of the holding hole;
wherein, denoting a length between a tip of the first plunger and the stab at a position in a direction of a central axis of the holding hole at time of inputting or outputting the signal as $D_1$, and denoting a length of the stab in a direction in which the stab extends from the central axis of the holding hole as $L_1$, the stab satisfies:

$$D_1 = \tan^{-1}\frac{1}{A_{SRW}} \times \frac{\lambda}{2\pi} \quad (1)$$

$$L_1 = \tan^{-1}\frac{A_{SRW}-1}{A_{SRW}} \times \frac{\lambda}{2\pi} \quad (2)$$

where $A_{SRW}$ is a standing wave ratio, $A_{SRW}=Z_0/Z_a$, where $Z_0$ is a characteristic impedance, $Z_a$ is a pure resistance ($<Z_0$), $\overline{A_{SRW}}$ (with a line on top thereof) is a conjugate complex number of $A_{SRW}$, and $\lambda$ is a wavelength at a particular frequency.

2. The conductive contactor unit according to claim 1, wherein
each of the holder substrate and the holding member includes two element members configured to form a boundary in a direction intersecting with an axial line direction of the opening, and divide the conductive contactor holder, and
the stab is formed between the two element members.

3. The conductive contactor unit according to claim 1, wherein a tip of the stab in an extending direction is brought into contact with an outer circumferential surface of the holder substrate.

4. The conductive contactor unit according to claim 3, further comprising an adjustment member inserted into a tip side of the stab in the extending direction, and configured to be capable of adjusting a length of the stab in the extending direction.

5. The conductive contactor unit according to claim 1, wherein
each of the holder substrate and the holding member includes two element members configured to divide the conductive contactor holder in a direction intersecting with an axial line direction of the opening, and
the stab is provided to one of the two element members.

6. The conductive contactor unit according to claim 5, wherein the stab forms a disk-like hollow space that is rotationally symmetric with respect to a central axis of the holding hole.

7. A conductive contactor unit comprising:
a signal conductive contactor configured to input or output a signal to or from a predetermined circuit structure, the signal conductive contactor including:
a first plunger configured to contact the predetermined circuit structure,
a second plunger connected to a circuit board configured to input or output the signal to or from the predetermined circuit structure, and
a spring member configured to connect the first plunger and the second plunger in an extendable and contractible manner; and a holder substrate including a plurality of housing units configured to house a plurality of the signal conductive contactors, respectively, wherein at least one of the first plunger and the second plunger includes a stab protruding from an outer surface in a direction perpendicular to an axial line direction of the plunger, wherein, denoting a length between a tip of the first plunger and the stab at a position in the axial line direction of the first plunger as $D_2$, and denoting a length of the stab from a central axis of the first plunger in a direction perpendicular to the axial line direction as $L_2$, the stab satisfies:

$$D_2 = \tan^{-1} \overline{B_{SRW}} \times \frac{\lambda}{2\pi} \qquad (3)$$

$$L_2 = \tan^{-1} \frac{\overline{B_{SRW}}}{B_{SRW} - 1} \times \frac{\lambda}{2\pi} \qquad (4)$$

where $B_{SRW}$ is a standing wave ratio, $B_{SRW} = Z_a/Z_0$, $Z_0$ is a characteristic impedance, $Z_a$ is a pure resistance ($>Z_0$), $\overline{B_{SRW}}$ (with a line on top thereof) is a conjugate complex number of $B_{SRW}$, and $\lambda$ is a wavelength at a particular frequency.

8. The conductive contactor unit according to claim 7, wherein the stab has a disk-like shape that is rotationally symmetric with respect an axial line of the plunger having the stab.

* * * * *